(12) United States Patent
Lee et al.

(10) Patent No.: US 8,252,192 B2
(45) Date of Patent: Aug. 28, 2012

(54) METHOD OF PATTERN ETCHING A DIELECTRIC FILM WHILE REMOVING A MASK LAYER

(75) Inventors: Yao-Sheng Lee, Tampa, FL (US); Vaidyanathan Balasubramaniam, Albany, NY (US); Masaru Nishino, Halfmoon, NY (US); Kelvin Zin, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 301 days.

(21) Appl. No.: 12/411,565

(22) Filed: Mar. 26, 2009

(65) Prior Publication Data

US 2010/0243604 A1    Sep. 30, 2010

(51) Int. Cl.
*C03C 15/00* (2006.01)
*C03C 25/68* (2006.01)
*C23F 1/00* (2006.01)

(52) U.S. Cl. .......................................................... 216/47
(58) Field of Classification Search ...................... 216/47
See application file for complete search history.

(56) References Cited

U.S. PATENT DOCUMENTS

| 2005/0266691 | A1* | 12/2005 | Gu et al. ........................ 438/706 |
| 2006/0286486 | A1* | 12/2006 | Huang ........................... 430/313 |
| 2006/0290012 | A1  | 12/2006 | Sadjadi |
| 2007/0287298 | A1* | 12/2007 | Ishibashi et al. .............. 438/725 |
| 2008/0054454 | A1* | 3/2008  | Kagawa et al. ................ 257/734 |

\* cited by examiner

*Primary Examiner* — Shamim Ahmed
*Assistant Examiner* — Bradford Gates
(74) *Attorney, Agent, or Firm* — Wood, Herron & Evans, LLP

(57) ABSTRACT

A method of pattern etching a thin film on a substrate is described. The method comprises preparing a film stack on a substrate, wherein the film stack comprises a dielectric layer formed on the substrate and a mask layer formed above the dielectric layer. A pattern is created in the mask layer, and the pattern is transferred from the mask layer to the dielectric layer by performing a plasma etching process. While transferring the pattern to the dielectric layer, the mask layer is substantially removed using the plasma etching process. The plasma etching process can use a process gas comprising a first gaseous component that etches the dielectric layer at a greater rate than the mask layer, and a second gaseous component that etches the dielectric layer at a lesser rate than the mask layer.

20 Claims, 10 Drawing Sheets

METHOD OF PATTERN ETCHING A DIELECTRIC FILM WHILE REMOVING A MASK LAYER

BACKGROUND OF THE INVENTION

1. Field of Invention

The invention relates to a method of pattern etching a thin film, and more particularly to a method for transferring a pattern to a thin film using a mask layer while substantially consuming the mask layer to avoid a subsequent mask removal process.

2. Description of Related Art

As is known to those in the semiconductor art, interconnect delay is a major limiting factor in the drive to improve the speed and performance of integrated circuits (ICs). One way to minimize interconnect delay is to reduce interconnect capacitance by using low dielectric constant (low-k) materials during production of the ICs. Such low-k materials have also proven useful for low temperature processing. Thus, in recent years, low-k materials have been developed to replace relatively high dielectric constant insulating materials, such as silicon dioxide. In particular, low-k films are being utilized for inter-level and intra-level dielectric layers between metal layers of semiconductor devices. Additionally, in order to further reduce the dielectric constant of insulating materials, material films are formed with pores, i.e., porous low-k materials. Such low-k materials can be deposited by a spin-on dielectric (SOD) method similar to the application of photoresist, or by chemical vapor deposition (CVD). Thus, the use of low-k materials is readily adaptable to existing semiconductor manufacturing processes. While low-k materials are promising for fabrication of semiconductor circuits, the present inventors have recognized that these films also provide many challenges. Both non-porous and porous low-k materials tend to be less robust than more traditional dielectric materials and can be damaged during wafer processing, such as by etch and plasma ashing processes generally used in patterning the dielectric materials.

SUMMARY OF THE INVENTION

The invention relates to a method for etching a thin film on a substrate.

The invention further relates to a method of pattern etching a thin film, and more particularly to a method for transferring a pattern to a thin film using a mask layer while substantially consuming the mask layer to avoid or reduce the need for a subsequent mask removal process.

According to one embodiment, a method of pattern etching a thin film on a substrate is described. The method comprises preparing a film stack on a substrate, wherein the film stack comprises a dielectric layer formed on the substrate, and a mask layer formed above the dielectric layer. The method also comprises creating a pattern in the mask layer, and transferring the pattern in the mask layer to the dielectric layer by performing a plasma etching process. The plasma etching process uses a process gas having a nitrogen-containing gas, a hydrogen-containing gas, and a fluorine-containing gas. Further, while transferring the pattern to the dielectric layer, the method comprises substantially removing the mask layer using the plasma etching process.

According to another embodiment, a method of pattern etching a thin film on a substrate is described. The method comprises preparing a film stack on a substrate, wherein the film stack comprises a dielectric layer formed on the substrate, and a multi-layer mask comprising a photoresist layer, an anti-reflective coating layer, and an organic planarization layer formed above the dielectric layer. The method also comprises creating a pattern in the multi-layer mask, and transferring the pattern in the multi-layer mask to the dielectric layer by performing a plasma etching process, wherein the plasma etching process uses a process gas having a nitrogen-containing gas, a hydrogen-containing gas, and a fluorine-containing gas. Further, while transferring the pattern to the dielectric layer, the method comprises substantially removing the organic planarization layer using the plasma etching process.

According to yet another embodiment, a method of pattern etching a thin film on a substrate is described. The method comprises preparing a film stack on a substrate, wherein the film stack comprises a dielectric layer formed on the substrate and a mask layer formed above the dielectric layer. A pattern is created in the mask layer, and the pattern is transferred from the mask layer to the dielectric layer by performing a plasma etching process. While transferring the pattern to the dielectric layer, the mask layer is substantially removed using the plasma etching process. The plasma etching process uses a process gas comprising a first gaseous component that etches the dielectric layer at a greater rate than the mask layer, and a second gaseous component that etches the dielectric layer at a lower rate than the mask layer.

DETAILED DESCRIPTION OF SEVERAL EMBODIMENTS

Figure 1A:
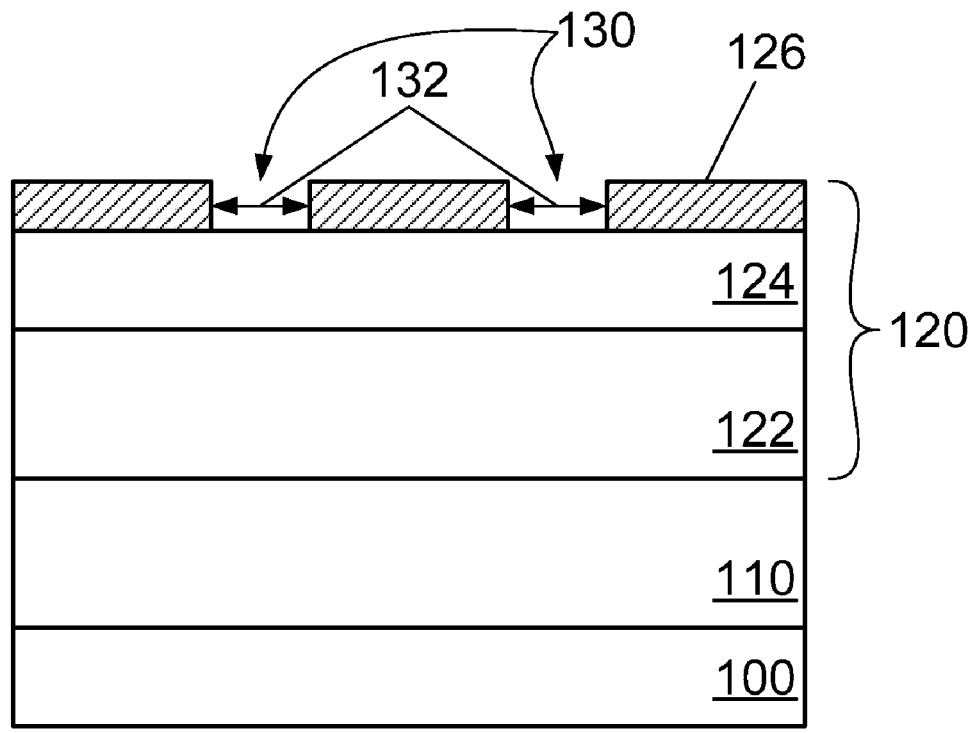
FIGS. 1A through 1D illustrate a schematic representation of a procedure for etching a feature in a substrate according to an embodiment.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

During fabrication of integrated circuits (ICs), semiconductor production equipment utilize a (dry) plasma etching process to remove or etch material along fine lines or within vias or contacts patterned on a semiconductor substrate. For example, during the etching of a substrate, plasma may be utilized to create reactive chemical species that are suitable for reacting with certain materials on the surface of a substrate, and/or to create charged species that are useful for delivering energy to surface reactions on the substrate. Typically, the success of the plasma etching process requires that the etch chemistry includes chemically reactive species and energetic species suitable for selectively etching one material, e.g., a thin film to be patterned, while substantially not etching another material, e.g., a mask layer and/or an etch stop layer.

According to one example, pattern etching comprises the application of a lithographic layer, such as a thin layer of radiation-sensitive material (e.g., photo-resist), to an upper surface of a substrate. The radiation-sensitive material is subsequently patterned in order to provide a mask for transferring this pattern to the underlying thin film on the substrate during etching. The patterning of the radiation-sensitive material generally involves exposure of the lithographic layer to a geometric pattern of electromagnetic (EM) radiation using, for example, a micro-lithography system, followed by the removal of the irradiated regions of the radiation-sensitive material (as in the case of positive photo-resist), or non-irradiated regions (as in the case of negative resist) using a developing solvent.

In order to pattern thinner features in the lithographic layer using conventional lithography techniques, multi-layer masks can be implemented. For example, the multi-layer mask may include a bilayer mask or trilayer mask. Additionally, for example, the multi-layer mask may include a radiation-sensitive layer, such as a photo-resist layer, an anti-reflective coating (ARC) layer underlying the photo-resist layer, and an organic planarization layer (OPL) underlying the ARC layer. With the inclusion of a second or third layer, the uppermost lithographic layer may be thinner than the thickness customarily chosen to withstand the subsequent dry etching process(es) and, therefore, using conventional lithography techniques, finer features may be formed in the thinner lithographic layer. Thereafter, the finer feature formed in the lithographic layer may be transferred to the underlying second or third layers using a dry development process, such as a dry etching process.

Once patterning of the thin film underlying the mask or multi-layer mask is completed as described above, the one or more mask layers remaining on the substrate are removed using an ashing process, such as a plasma ashing process, and/or a stripping process, such as a wet stripping process. However, as described above, this plasma ashing process has been found to damage the underlying layer of low-k material. As a consequence, some low-k films tend to be highly reactive when damaged, particularly after patterning, thereby allowing the low-k material to absorb water and/or react with other vapors and/or process contaminants that can alter the electrical properties of the dielectric layer. Therefore, according to an embodiment, a method of etching a feature in a substrate is schematically illustrated in FIGS. 1A through 1D, and is illustrated in a flow chart 500 in FIG. 2. The method begins in 510 with preparing a film stack on a substrate 100, wherein the film stack comprises a thin film 110, such as a dielectric layer, formed on the substrate 100, and a mask layer 120 having, for example, multiple layers formed above the thin film 110. The mask layer 120 may comprise a lithographic layer 126, a second mask layer 124 and a third mask layer 122.

The substrate 100 may comprise a semiconductor substrate, a wafer, a flat panel display or a liquid crystal display.

The thin film 110 may comprise a conductive layer, a non-conductive layer, or a semi-conductive layer. For instance, the thin film 110 may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, or silicon oxynitride, etc. Additionally, for instance, the thin film 110 may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film 110 may have a dielectric constant of less than 3.7, or a dielectric constant ranging from 1.6 to 3.7.

These dielectric layers may include at least one of an organic, inorganic, or inorganic-organic hybrid material. Additionally, these dielectric layers may be porous or non-porous.

For example, these dielectric layers may include an inorganic, silicate-based material, such as carbon doped silicon oxide (or organo siloxane), deposited using CVD techniques. Examples of such films include Black Diamond® CVD organosilicate glass (OSG) films commercially available from Applied Materials, Inc., or Coral® CVD films commercially available from Novellus Systems, Inc.

Alternatively, these dielectric layers may include porous inorganic-organic hybrid films comprised of a single-phase, such as a silicon oxide-based matrix having $CH_3$ species or groups that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process.

Still alternatively, these dielectric layers may include an inorganic, silicate-based material, such as hydrogen silsesquioxane (HSQ) or methyl silsesquioxane (MSQ), deposited using SOD (spin-on dielectric) techniques. Examples of such films include FOx® HSQ commercially available from Dow Corning, XLK porous HSQ commercially available from Dow Corning, and JSR LKD-5109 commercially available from JSR Microelectronics.

Still alternatively, these dielectric layers can comprise an organic material deposited using SOD techniques. Examples of such films include SiLK-I, SiLK-J, SiLK-H, SiLK-D, and porous SiLK® semiconductor dielectric resins commercially available from Dow Chemical, and GX-3™, and GX-3P™ semiconductor dielectric resins commercially available from Honeywell.

The thin film 110 can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

The lithographic layer 126 may comprise a layer of radiation-sensitive material, such as photo-resist. The photo-resist layer may comprise 248 nm (nanometer) resists, 193 nm resists, 157 nm resists, EUV (extreme ultraviolet) resists, or electron beam sensitive resist. The photo-resist layer can be formed using a track system. For example, the track system can comprise a Clean Track ACT 8, ACT 12, or Lithius resist coating and developing system commercially available from Tokyo Electron Limited (TEL). Other systems and methods for forming a photo-resist layer on a substrate are well known to those skilled in the art of spin-on resist technology.

The second mask layer 124 can comprise a silicon-containing layer, such as a silicon-containing anti-reflective coating (ARC) layer. For example, the second mask layer 124 may comprise a silicon-containing ARC having a silicon content of about 43% by weight or less. Additionally, for example, the second mask layer 124 may comprise a silicon-containing ARC having a silicon content of about 30% by weight or less. Additionally, for example, the second mask layer 124 may comprise a silicon-containing ARC having a silicon content of about 20% by weight or less. Additionally yet, for example, the second mask layer 124 may comprise a silicon-containing ARC having a silicon content of about 17% by weight. Furthermore, for example, the second mask layer 124 may comprise a silicon-containing ARC commercially available as Sepr-Shb A-series SiARC from Shin Etsu Chemical Co., Ltd. The second mask layer 124 may, for example, be applied using spin coating technology, or a vapor deposition process.

The third mask layer 122 may comprise an inorganic layer or an organic layer. For example, the third mask layer 122 may comprise an organic dielectric layer (ODL) or an organic planarization layer (OPL). The ODL can include a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques.

Figure 2:
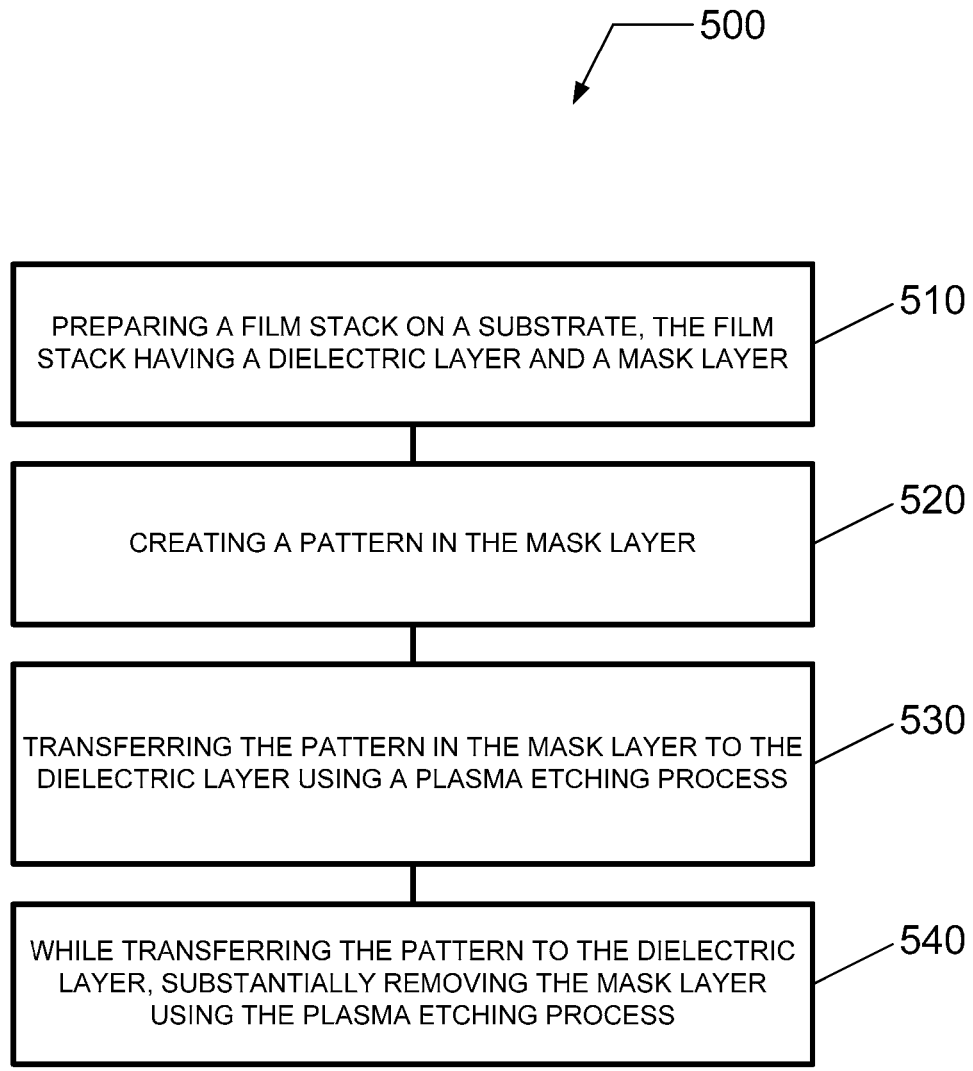
FIG. 2 provides a flow chart illustrating a method of etching a feature in a substrate according to an embodiment.

In 520 of FIG. 2, a pattern 130 is created in the mask layer 120. The lithographic layer 126 is imaged with an image pattern of EM radiation. The exposure to EM radiation through a reticle is performed in a dry or wet photo-lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Thereafter, the image pattern is developed in the lithographic layer 126 to form pattern 130 in the lithographic layer 126 having a first critical dimension (CD) 132. The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL).

Figure 1B:
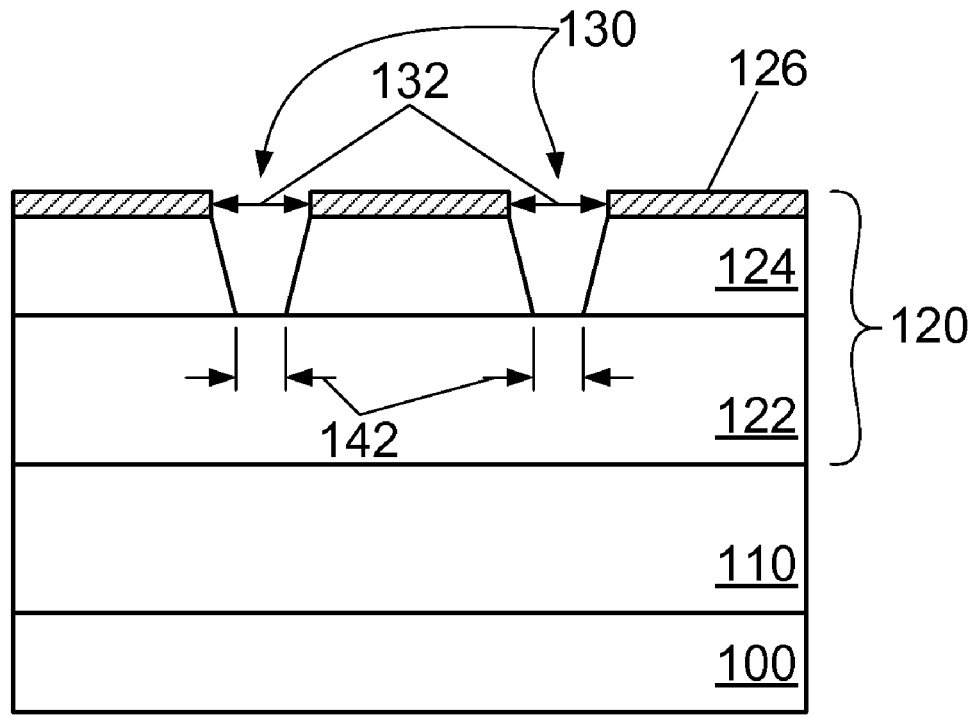

As shown in FIG. 1B, the pattern 130 is transferred from the lithographic layer 126 to the second mask layer 124, such as a silicon-containing ARC layer, using a dry plasma etching process. A process recipe may be established that is configured to cause a reduction of the first CD 132 of the pattern 130 in the lithographic layer 126 to a second CD 142 of the pattern 130 in the second mask layer 124.

As an example, the process recipe for transferring pattern 130 to the second mask layer may comprise: introducing a process gas to the plasma processing system according to the process recipe, the process gas comprising a nitrogen-containing gas, a hydrogen-containing gas, and a $C_xH_yF_z$-containing gas, wherein x, y, and z are integers greater than or equal to unity; forming plasma from the process gas in the plasma processing system according to the process recipe; and, exposing the substrate 100 to the plasma in order to transfer the pattern 130 in the lithographic layer 126 to the underlying second mask layer 124, i.e., silicon-containing ARC layer.

The nitrogen-containing gas may comprise $N_2$, $NH_3$, NO, $NO_2$, or $N_2O$, any combination of two or more thereof. The hydrogen-containing gas may comprise $H_2$, or $NH_3$, or both. The $C_xF_yH_z$-containing gas may include any gas containing carbon (C), fluorine (F), and hydrogen (H) (e.g., a hydrofluorocarbon gas). For example, the hydrofluorocarbon gas may include trifluoromethane ($CHF_3$), or difluoromethane ($CH_2F_2$), or both.

The process gas can further comprise an inert gas. Alternatively, the process gas can comprise a noble gas. Alternatively yet, the process gas can comprise argon (Ar).

In one example, the process gas comprises $N_2$ and $H_2$. In another example, the process gas comprises $NH_3$. In another embodiment, the process gas comprises $N_2$, $H_2$, and $CH_2F_2$. In yet another embodiment, the process gas comprises $NH_3$ and $CH_2F_2$.

The process recipe may further comprise: setting a flow rate of one or more constituents of the process gas; setting a pressure in the plasma processing system; setting a first power level for a first radio frequency (RF) signal applied to a lower electrode within a substrate holder for supporting the substrate; and setting a second power level for a second RF signal applied to an upper electrode opposing the lower electrode above the substrate. The flow rate of one or more constituents of the process gas may be set to a value ranging from about 100 sccm (standard cubic centimeters per minute) to about 500 sccm. The pressure may be set to about 100 mtorr (millitorr) or less. Alternatively, the pressure may be set to about 50 mtorr or less. Alternatively yet, the pressure may be set to about 30 mtorr or less The first power level may be set to about 300 W (watts) or less. Alternatively, the first power level may be set to about 200 W or less. The second power level may be set to a value ranging from about 100 W to about 1000 W. Alternatively, the second power level may be set to a value ranging from about 300 W to about 600 W. Additional details for a plasma processing system are provided below.

As shown in FIG. 1B, during the pattern transfer, the first CD 132 for the feature pattern 130 in the lithographic layer 126 may be reduced to the second CD 142 in the second mask layer 124. According to embodiments of the invention, the target CD bias, i.e., difference between the first CD 132 and the second CD 142, may be substantially zero, positive, or negative. When forming plasma from the process gas, a process recipe may be selected to cause a reduction in an offset between a first CD bias for nested structures in a feature pattern and a second CD bias for isolated structures in the feature pattern, wherein the first CD bias is measured as a difference between a first CD for nested structures of the feature pattern in the lithographic layer and a second CD for nested structures of the feature pattern in the second mask layer, and the second CD bias is measured as a difference between a first CD for isolated structures of the feature pattern in the lithographic layer and a second CD for isolated structures of the feature pattern in the second mask layer. For example, the process recipe can include: (1) selecting an amount of the process gas or constituent of the process gas; (2) selecting a process pressure and one or more power levels for forming plasma; and (3) selecting an etch time.

Once the pattern 130 extends through the thickness of the second mask layer 124, the etch time may be extended in order to increase or decrease the amount of difference between the first CD 132 and the second CD 142. By extending the etch time, the inventors have observed that the plasma chemistry and ion bombardment can enlarge the second CD 142 relative to first CD 132.

Figure 1C:
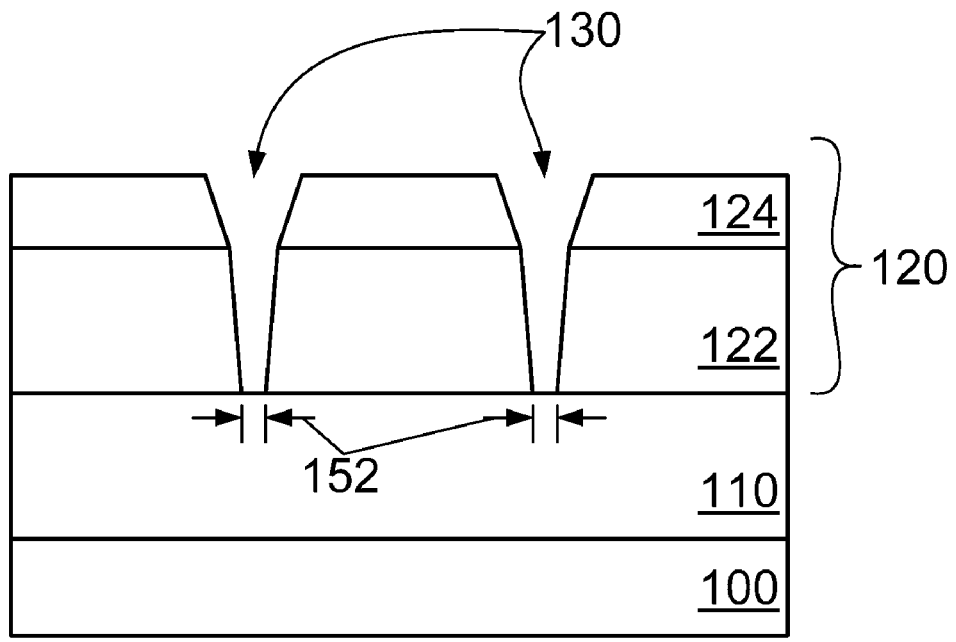

As shown in FIG. 1C, the pattern 130 having second CD 142 formed in the second mask layer 124 can be transferred to the underlying third mask layer 122 to form a third CD 152 in the third mask layer 122 using one or more etching processes. The third CD 152 can be substantially the same as the second CD 142, or it may be less than the second CD 142 as illustrated in FIG. 1C. The one or more etching processes may include any combination of wet or dry etching processes. The dry etching processes may include dry plasma etching processes or dry non-plasma etching processes. For example, the one or more etching processes may include a dry plasma etching process that utilizes plasma formed from a process gas containing $N_2$ and $H_2$. However, other process gases may be used, including $O_2$, CO, and $CO_2$.

During the transfer of pattern 130 to the second mask layer 124 and the third mask layer 122, the lithographic layer 126 may be fully consumed as shown in FIG. 1C. Further, during the transfer of pattern 130 to the second mask layer 124 and the third mask layer 122, the second mask layer 124 may or may not be consumed. For example, the second mask layer 124 may not be completely consumed as shown in FIG. 1C. Alternatively, for example, the second mask layer 124 may be completely consumed, leaving only the third mask layer 122 lying above the thin film 110.

Figure 1D:
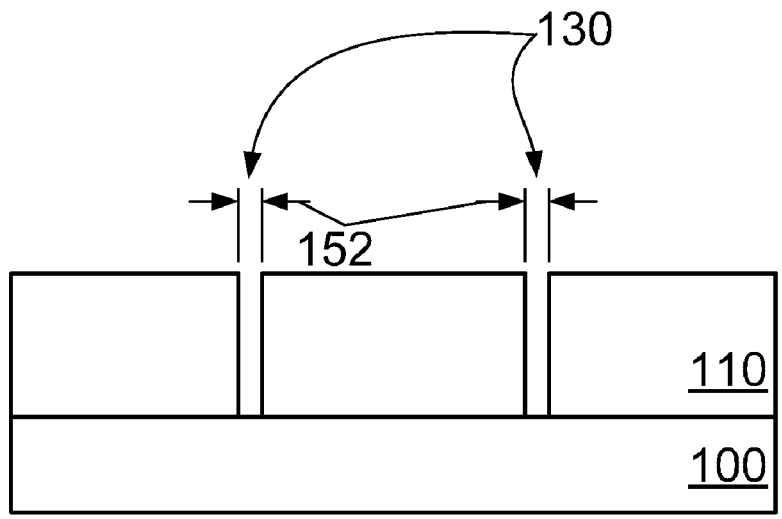

As shown in FIG. 1D and in 530 of FIG. 2, the pattern 130 having third CD 152 formed in the third mask layer 122 can be transferred to the underlying thin film 110 using one or more etching processes, such as a plasma etching process. A process recipe may be established that is configured to transfer pattern 130 to the underlying thin film 110, while, in 540, substantially removing the mask layer 120, which may include the third mask layer 122, using the plasma etching process. By removing the third mask layer 122 while completing the transfer of pattern 130 to the underlying thin film 110, an exposure of the underlying thin film 110 to an ashing process, required to remove the remainder of mask layer 120 including the third mask layer 122, may be avoided or substantially reduced.

As an example, the process recipe for transferring pattern 130 to the underlying thin film 110 may comprise using a process gas having a first gaseous component that etches the thin film 110, e.g., the dielectric layer, at a greater rate than the mask layer 120, and a second gaseous component that etches the thin film 110, e.g., the dielectric layer, at a lower rate than the mask layer 120.

The process recipe for transferring pattern 130 to the underlying thin film 110 may comprise: introducing a process gas to the plasma processing system according to the process recipe, the process gas comprising the first gaseous component having a fluorine-containing gas, such as a $C_xF_yH_z$-containing gas, wherein x and y are integers greater than or equal to unity, and z is an integer greater than or equal to zero, and the second gaseous component having a nitrogen-containing gas and a hydrogen-containing gas; forming plasma from the process gas in the plasma processing system according to the process recipe; and, exposing the substrate 100 to the plasma in order to transfer the pattern 130 in the mask layer 120 to the thin film 110 (in 530), while substantially removing the mask layer 120, e.g., the third mask layer 122. The process recipe may or may not further include an over-etch step.

The nitrogen-containing gas may comprise $N_2$, $NH_3$, NO, $NO_2$, or $N_2O$, any combination of two or more thereof. The hydrogen-containing gas may comprise $H_2$, or $NH_3$, or both. The fluorine-containing gas may comprise $SF_6$, $NF_3$, or a $C_xF_yH_z$-containing gas. The $C_xF_yH_z$-containing gas may include any gas containing carbon (C), fluorine (F), and optionally hydrogen (H) (e.g., a fluorocarbon gas or a hydrofluorocarbon gas). For example, the hydrofluorocarbon gas may include trifluoromethane ($CHF_3$), or difluoromethane ($CH_2F_2$), or both. The $C_xF_yH_z$-containing gas may or may not include H. Thus, for example, the $C_xF_yH_z$-containing gas may include a $C_xF_y$ gas, such as $CF_4$, $C_4F_6$, $C_4F_8$, or $C_5F_8$, or any combination of two or more thereof.

The process gas can further comprise an inert gas. Alternatively, the process gas can comprise a noble gas. Alternatively yet, the process gas can comprise argon (Ar).

In one example, the process gas comprises or consists of $N_2$, $H_2$, and a fluorine-containing gas. In another example, the process gas comprises or consists of $NH_3$, and a fluorine-containing gas. In another example, the process gas comprises or consists of $N_2$, $H_2$, and a $C_xF_yH_z$-containing gas. In yet another example, the process comprises or consists of $NH_3$ and a $C_xF_yH_z$-containing gas.

The process recipe may also comprise: setting a flow rate of one or more constituents of the process gas; setting a pressure in the plasma processing system; setting a first power level for a first radio frequency (RF) signal applied to a lower electrode within a substrate holder for supporting the substrate; and setting a second power level for a second RF signal applied to an upper electrode opposing the lower electrode above the substrate. The flow rate of one or more constituents of the process gas may be set to a value ranging from about 1 sccm (standard cubic centimeters per minute) to about 1000 sccm. The pressure may be set to about 500 mtorr (millitorr) or less. Alternatively, the pressure may be set to about 100 mtorr or less. Alternatively yet, the pressure may be set to about 50 mtorr or less The first power level may be set to about 2000 W (watts) or less. Alternatively, the first power level may be set to about 1000 W or less. The second power level may be set to a value ranging from about 10 W to about 1000 W. Alternatively, the second power level may be set to a value ranging from about 100 W to about 500 W. Additional details for a plasma processing system are provided below.

Additionally, the process recipe may be established such that an etch rate of the thin film 110 is approximately the same as an etch rate for the mask layer 120. Alternatively, the process recipe may be established such that an etch rate of the thin film 110 is greater than an etch rate for the mask layer 120 when an initial thickness of the thin film 110 is greater than a thickness of the mask layer 120 immediately prior to transferring the pattern 130 to the underlying thin film 110. Alternatively yet, the process recipe may be established such that an etch rate of the thin film 110 is less than an etch rate for the mask layer 120 when an initial thickness of the thin film 110 is less than a thickness of the mask layer 120 immediately prior to transferring the pattern 130 to the underlying thin film 110.

Furthermore, the process recipe may be established such that an etch selectivity between the thin film 110, e.g., a dielectric layer, and the mask layer 120 may be varied by adjusting an amount of the first gaseous component, e.g., the fluorine-containing gas, relative to an amount of the second gaseous component, e.g., the nitrogen-containing gas and the hydrogen-containing gas. The adjustment of the etch selectivity may take place in a step-wise manner, and/or it may vary up or down according to the process recipe. The etch selectivity between the thin film 110 and the mask layer 120 may be adjusted prior to the transfer of pattern 130 to the underlying thin film 110 using data from prior substrate runs. Alternatively, the etch selectivity between the thin film 110 and the mask layer 120 may be adjusted during the transfer of pattern 130 to the underlying thin film 110 using data acquired for the pattern transfer process from, for example, prior substrate runs, or data acquired during the pattern transfer process from, for example, in-situ measurement, or both. Alternatively, the etch selectivity between the thin film 110 and the mask layer 120 may be adjusted following the transfer of pattern 130 to the underlying thin film 110 using data from the current substrate run.

For instance, the process recipe may be established such that an etch selectivity between the thin film 110, e.g., dielectric layer, and the mask layer 120 may be reduced during the transfer of pattern 130 to the underlying thin film 110 by decreasing an amount of the first gaseous component, e.g., fluorine-containing gas, relative to an amount of the second gaseous component, e.g., the nitrogen-containing gas and the hydrogen-containing gas. The amount of the first gaseous component may be decreased, while the amount of the second gaseous component remains the same or is increased. Alternatively, the amount of the first gaseous component may be kept the same, while the amount of the second gaseous component remains is increased. Alternatively, the amount of the first gaseous component may be increased, while the amount of the second gaseous component is increased at a relatively greater rate than that of the amount of the first gaseous component.

Thereafter, substrate 100 may be subjected to one or more wet cleaning processes.

Figure 3:
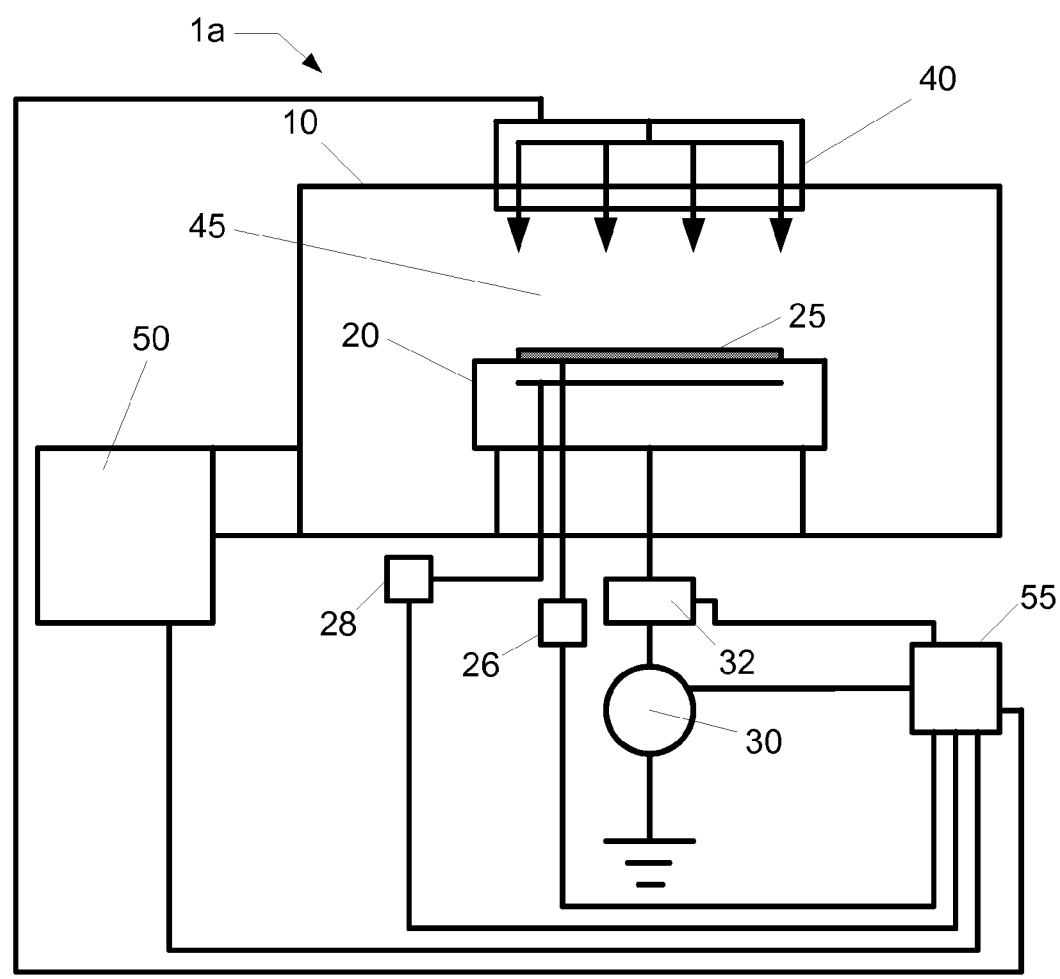
FIG. 3 shows a schematic representation of a processing system according to an embodiment.

According to one embodiment, a processing system 1a configured to perform the above identified process conditions is depicted in FIG. 3 comprising a plasma processing chamber 10, substrate holder 20, upon which a substrate 25 to be processed is affixed, and vacuum pumping system 50. Substrate 25 can be a semiconductor substrate, a wafer, a flat panel display, or a liquid crystal display. Plasma processing chamber 10 can be configured to facilitate the generation of plasma in plasma processing region 45 in the vicinity of a surface of substrate 25. An ionizable gas or mixture of process gases is introduced via a gas distribution system 40. For a given flow of process gas, the process pressure is adjusted using the vacuum pumping system 50. Plasma can be utilized to create materials specific to a pre-determined materials process, and/or to aid the removal of material from the exposed surfaces of substrate 25. The plasma processing system 1a can be configured to process substrates of any desired size, such as 200 mm substrates, 300 mm substrates, or larger.

Substrate 25 can be affixed to the substrate holder 20 via a clamping system 28, such as a mechanical clamping system or an electrical clamping system (e.g., an electrostatic clamping system). Furthermore, substrate holder 20 can include a heating system (not shown) or a cooling system (not shown) that is configured to adjust and/or control the temperature of substrate holder 20 and substrate 25. The heating system or cooling system may comprise a re-circulating flow of heat transfer fluid that receives heat from substrate holder 20 and transfers heat to a heat exchanger system (not shown) when cooling, or transfers heat from the heat exchanger system to substrate holder 20 when heating. In other embodiments, heating/cooling elements, such as resistive heating elements, or thermoelectric heaters/coolers can be included in the substrate holder 20, as well as the chamber wall of the plasma processing chamber 10 and any other component within the plasma processing system 1a.

Additionally, a heat transfer gas can be delivered to the backside of substrate 25 via a backside gas supply system 26 in order to improve the gas-gap thermal conductance between substrate 25 and substrate holder 20. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 25.

In the embodiment shown in FIG. 3, substrate holder 20 can comprise an electrode through which RF power is coupled to the processing plasma in plasma processing region 45. For example, substrate holder 20 can be electrically biased at a RF voltage via the transmission of RF power from a RF generator 30 through an optional impedance match network 32 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 32 can improve the transfer of RF power to plasma in plasma processing chamber 10 by reducing the reflected power. Match network topologies (e.g. L-type, π-type, T-type, etc.) and automatic control methods are well known to those skilled in the art.

Gas distribution system 40 may comprise a showerhead design for introducing a mixture of process gases. Alternatively, gas distribution system 40 may comprise a multi-zone showerhead design for introducing a mixture of process gases and adjusting the distribution of the mixture of process gases above substrate 25. For example, the multi-zone showerhead design may be configured to adjust the process gas flow or composition to a substantially peripheral region above substrate 25 relative to the amount of process gas flow or composition to a substantially central region above substrate 25.

Vacuum pumping system 50 can include a turbo-molecular vacuum pump (TMP) capable of a pumping speed up to about 5000 liters per second (and greater) and a gate valve for throttling the chamber pressure. In conventional plasma processing devices utilized for dry plasma etch, a 1000 to 3000 liter per second TMP can be employed. TMPs are useful for low pressure processing, typically less than about 50 mtorr. For high pressure processing (i.e., greater than about 100 mtorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 55 comprises a microprocessor, memory, and a digital I/O port capable of generating control voltages sufficient to communicate and activate inputs to plasma processing system 1a as well as monitor outputs from plasma processing system 1a. Moreover, controller 55 can be coupled to and can exchange information with RF generator 30, impedance match network 32, the gas distribution system 40, vacuum pumping system 50, as well as the substrate heating/cooling system (not shown), the backside gas supply system 26, and/or the electrostatic clamping system 28. For example, a program stored in the memory can be utilized to activate the inputs to the aforementioned components of plasma processing system 1a according to a process recipe in order to perform a plasma assisted process on substrate 25.

Controller 55 can be locally located relative to the plasma processing system 1a, or it can be remotely located relative to the plasma processing system 1a. For example, controller 55 can exchange data with plasma processing system 1a using a direct connection, an intranet, and/or the internet. Controller 55 can be coupled to an intranet at, for example, a customer site (i.e., a device maker, etc.), or it can be coupled to an intranet at, for example, a vendor site (i.e., an equipment manufacturer). Alternatively or additionally, controller 55 can be coupled to the internet. Furthermore, another computer (i.e., controller, server, etc.) can access controller 55 to exchange data via a direct connection, an intranet, and/or the internet.

In the embodiment shown in FIG. 4, plasma processing system 1b can be similar to the embodiment of FIG. 3 and further comprise either a stationary, or mechanically or electrically rotating magnetic field system 60, in order to potentially increase plasma density and/or improve plasma processing uniformity, in addition to those components described with reference to FIG. 3. Moreover, controller 55 can be coupled to magnetic field system 60 in order to regulate the speed of rotation and field strength. The design and implementation of a rotating magnetic field is well known to those skilled in the art.

Figure 4:
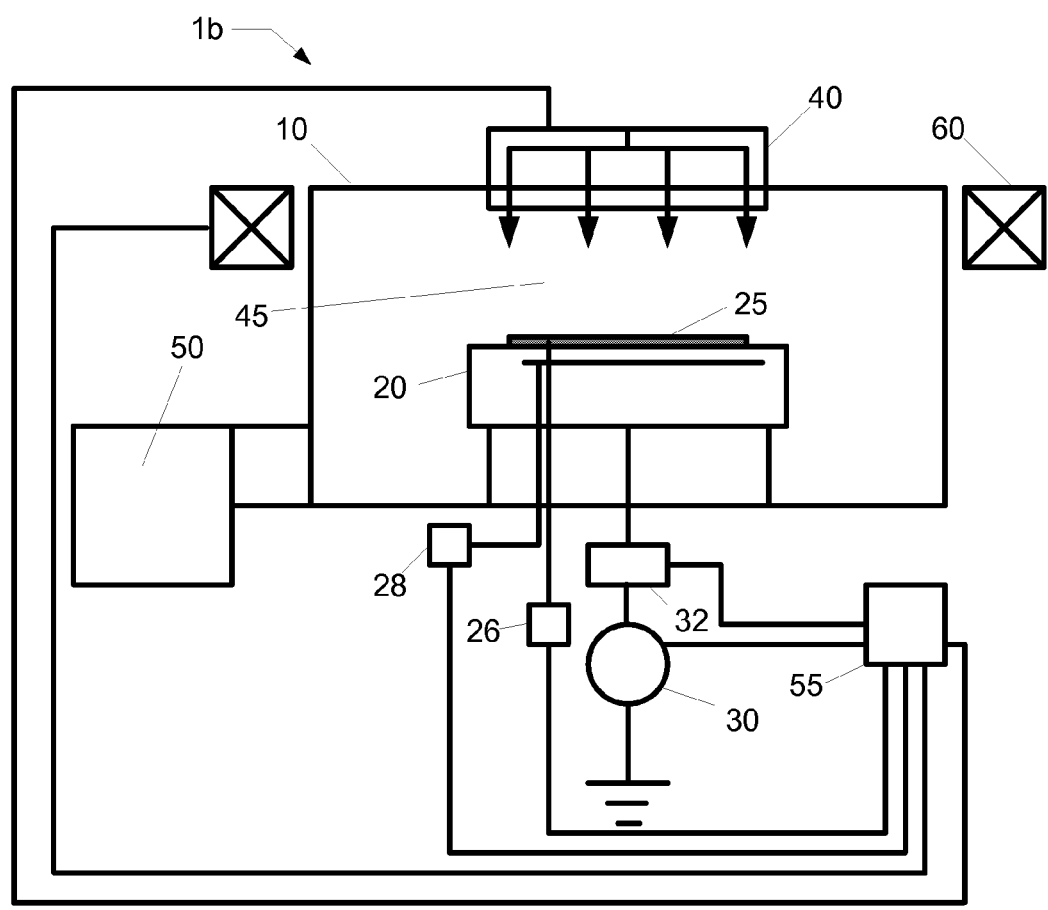
FIG. 4 shows a schematic representation of a processing system according to another embodiment.
Figure 5:
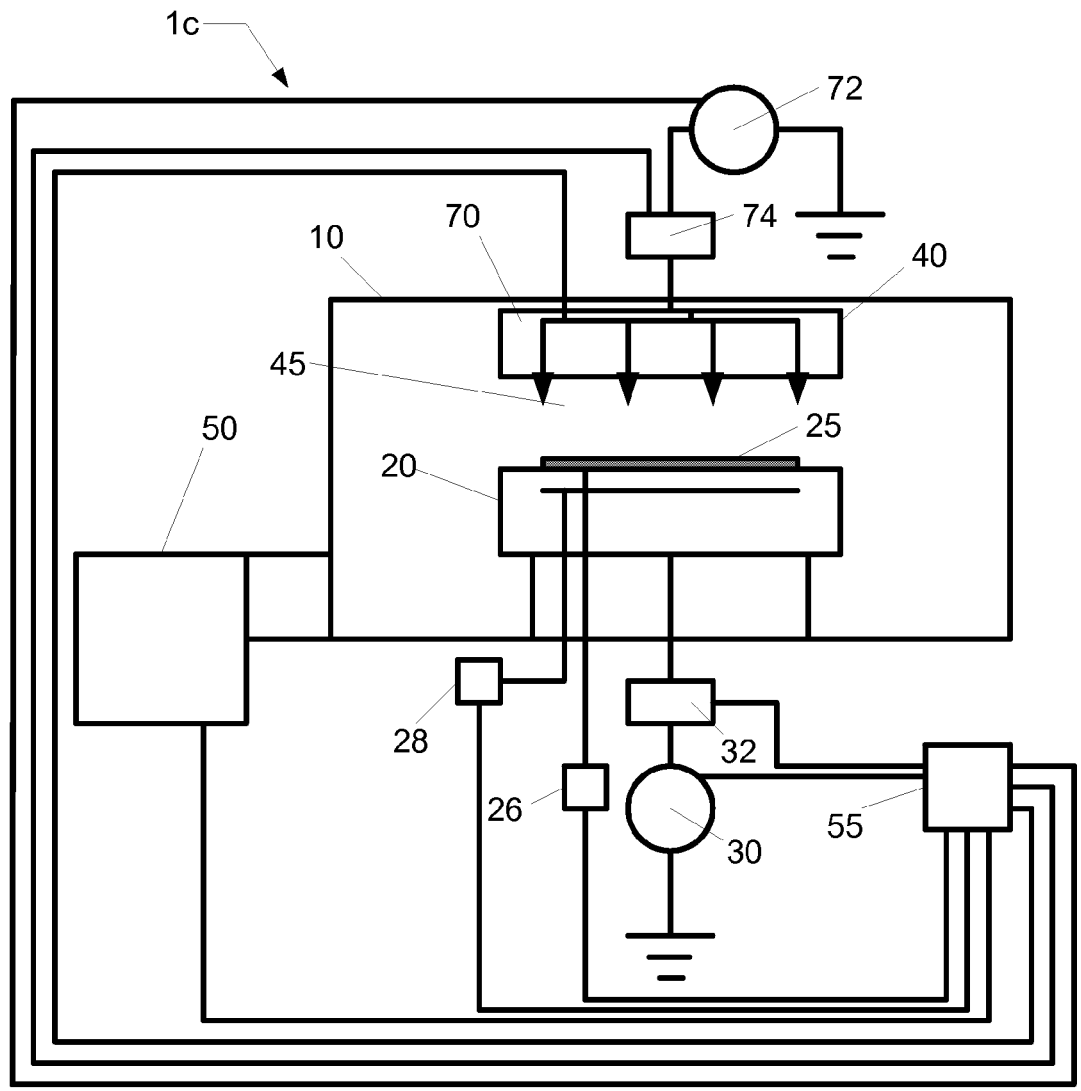
FIG. 5 shows a schematic representation of a processing system according to another embodiment.

In the embodiment shown in FIG. 5, plasma processing system 1c can be similar to the embodiment of FIG. 3 or FIG. 4, and can further comprise an upper electrode 70 to which RF power can be coupled from RF generator 72 through optional impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 55 is coupled to RF generator 72 and impedance match network 74 in order to control the application of RF power to upper electrode 70. The design and implementation of an upper electrode suitable for plasma etching is well known to those skilled in the art. The upper electrode 70 and the gas distribution system 40 can be designed within the same chamber assembly, as shown.

Figure 6:
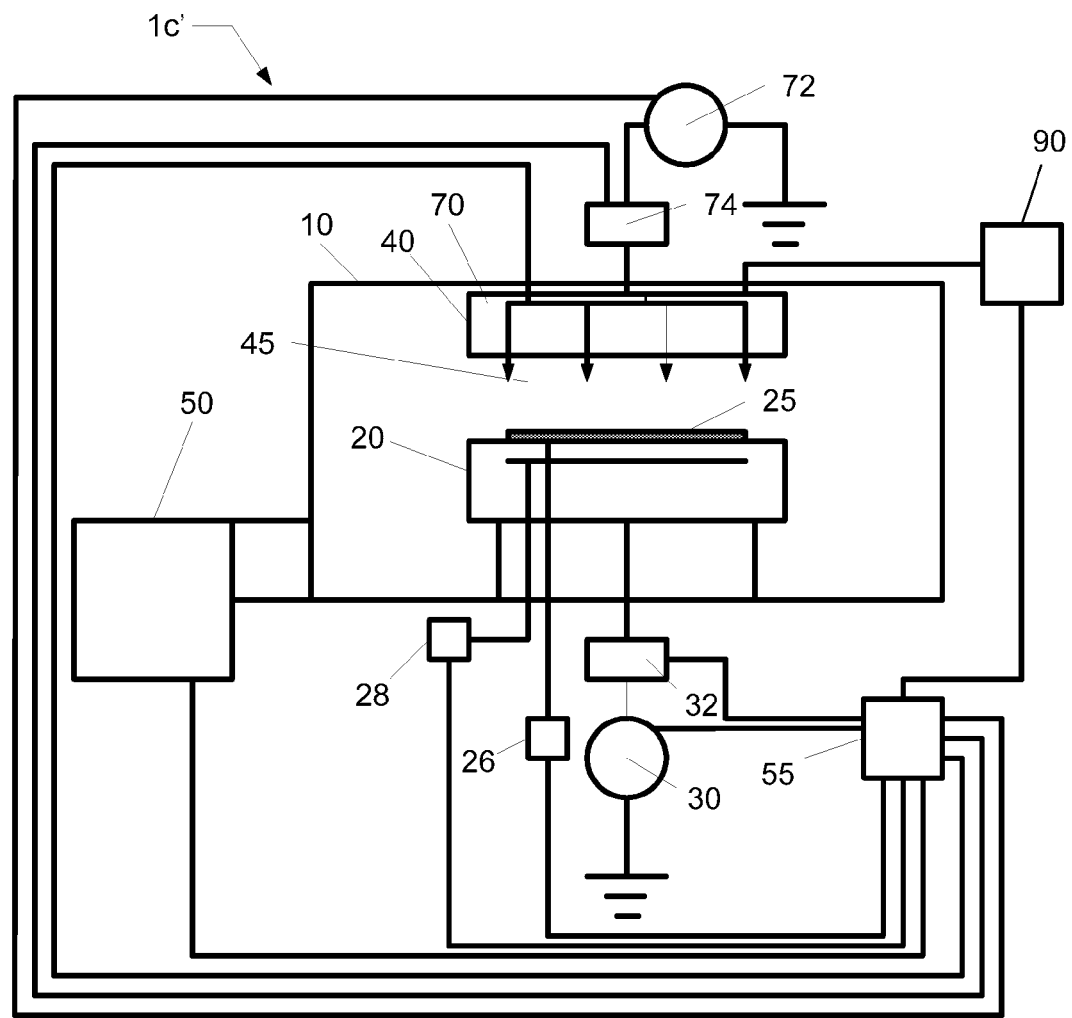
FIG. 6 shows a schematic representation of a processing system according to another embodiment.

In the embodiment shown in FIG. 6, plasma processing system 1c' can be similar to the embodiment of FIG. 5, and can further comprise a direct current (DC) power supply 90 coupled to the upper electrode 70 opposing substrate 25. The upper electrode 70 may comprise an electrode plate. The electrode plate may comprise a silicon-containing electrode plate. Moreover, the electrode plate may comprise a doped silicon electrode plate. The DC power supply 90 can include a variable DC power supply. Additionally, the DC power supply can include a bipolar DC power supply. The DC power supply 90 can further include a system configured to perform at least one of monitoring adjusting, or controlling the polarity, current, voltage, or on/off state of the DC power supply 90. Once plasma is formed, the DC power supply 90 facilitates the formation of a ballistic electron beam. An electrical filter may be utilized to de-couple RF power from the DC power supply 90.

For example, the DC voltage applied to upper electrode 70 by DC power supply 90 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 70. The surface of the upper electrode 70 facing the substrate holder 20 may be comprised of a silicon-containing material.

Figure 7:
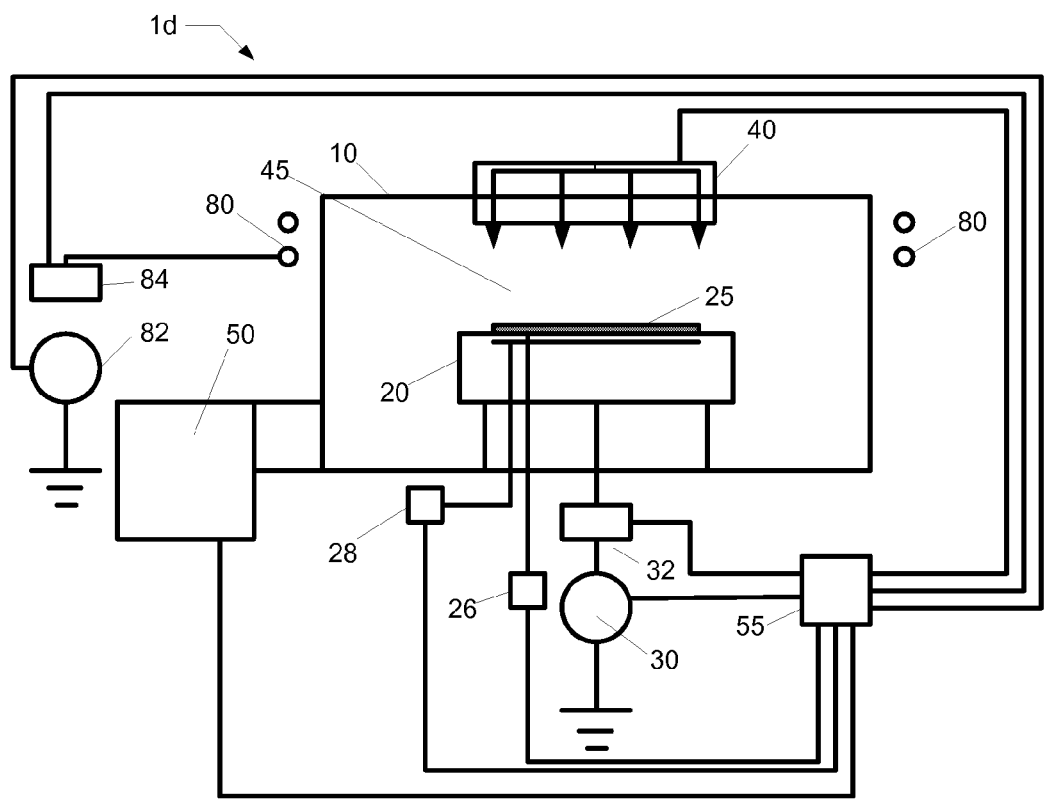
FIG. 7 shows a schematic representation of a processing system according to another embodiment.

In the embodiment shown in FIG. 7, plasma processing system 1d can be similar to the embodiments of FIGS. 3 and 4, and can further comprise an inductive coil 80 to which RF power is coupled via RF generator 82 through optional impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma in the processing region 45. Moreover, controller 55 can be coupled to RF generator 82 and impedance match network 84 in order to control the application of power to inductive coil 80.

Figure 8:
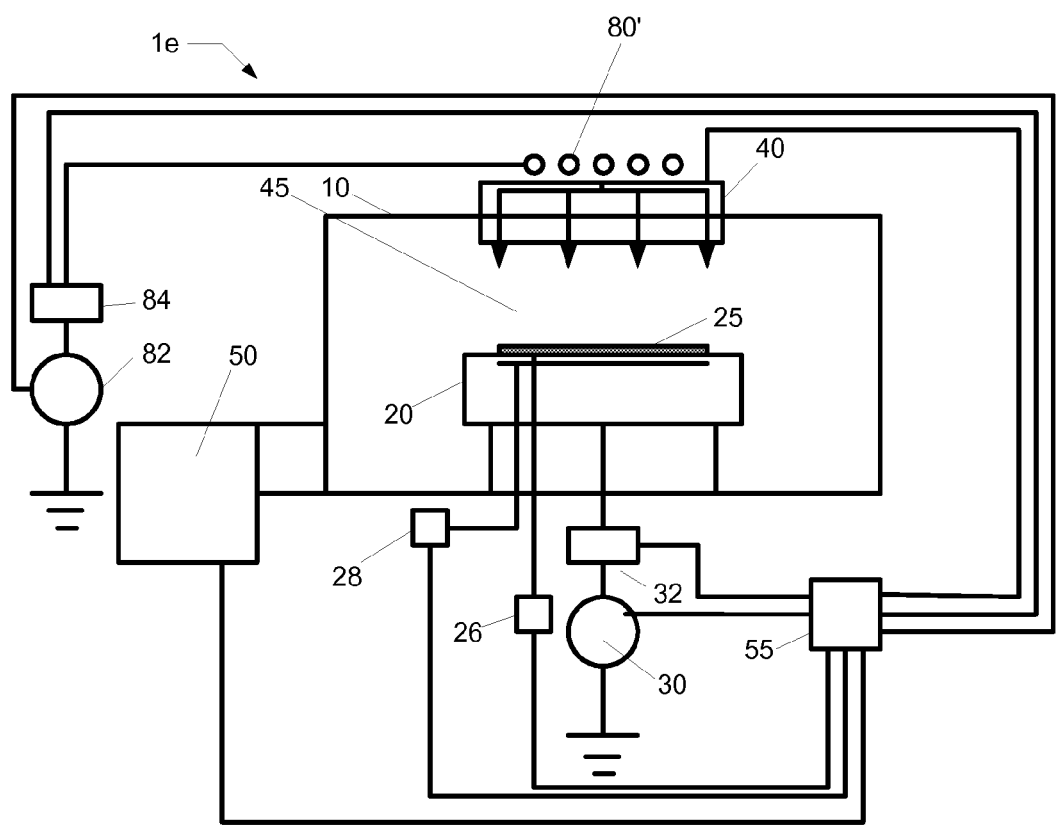
FIG. 8 shows a schematic representation of a processing system according to another embodiment.

In an alternate embodiment, as shown in FIG. 8, plasma processing system 1e can be similar to the embodiment of FIG. 7, and can further comprise an inductive coil 80' that is a "spiral" coil or "pancake" coil in communication with the plasma processing region 45 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 9:
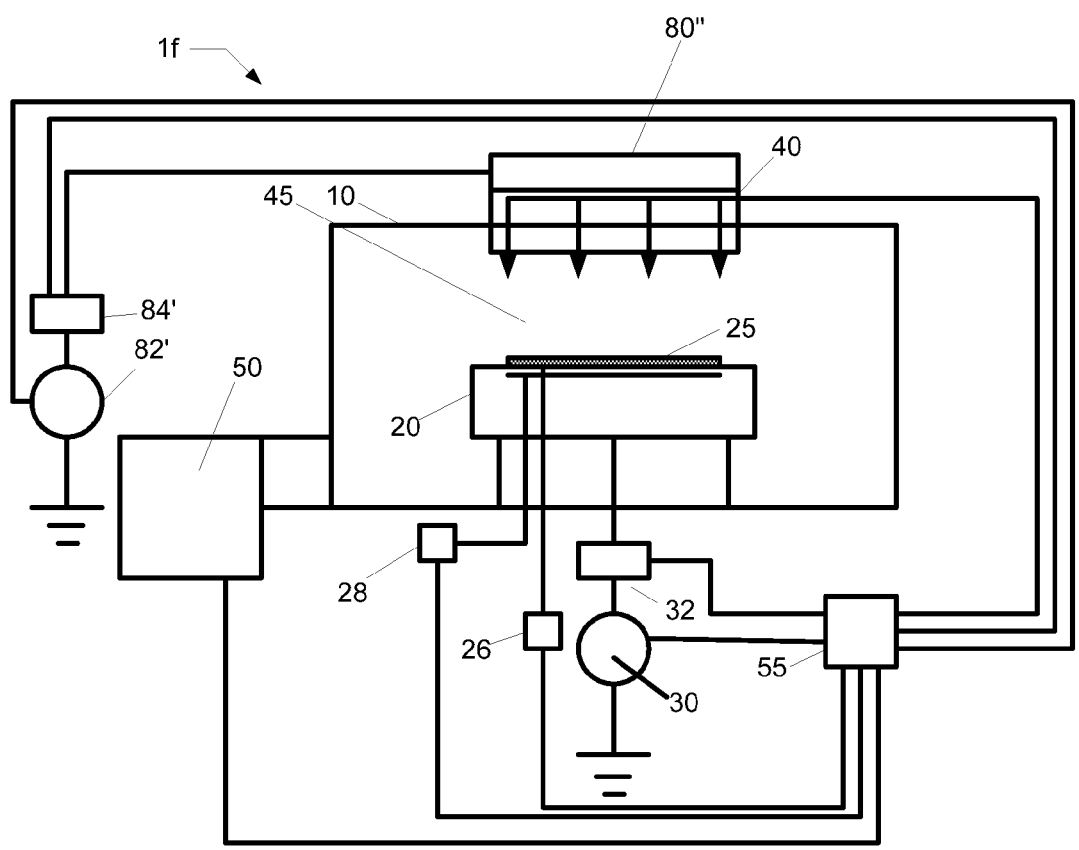
FIG. 9 shows a schematic representation of a processing system according to another embodiment.

In the embodiment shown in FIG. 9, plasma processing system if can be similar to the embodiments of FIGS. 3 and 4, and can further comprise a surface wave plasma (SWP) source 80". The SWP source 80" can comprise a slot antenna, such as a radial line slot antenna (RLSA), to which microwave power is coupled via microwave generator 82' through optional impedance match network 84'.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of pattern etching a thin film on a substrate, comprising:
preparing a film stack on a substrate, said film stack comprising a dielectric layer formed on said substrate, and a mask comprising one or more mask layers formed above said dielectric layer;
creating a pattern in said mask through each of said one or more mask layers;
transferring said pattern in said mask to said dielectric layer by performing a plasma etching process, wherein said plasma etching process uses a process gas having a nitrogen-containing gas, a hydrogen-containing gas, and a fluorine-containing gas; and
while transferring said pattern to said dielectric layer, substantially removing any remaining portion of each of said one or more mask layers of said mask using said plasma etching process.

2. The method of claim 1, wherein said mask comprises an organic layer.

3. The method of claim 1, wherein said mask comprises a layer of radiation-sensitive material.

4. The method of claim 1, wherein said mask comprises a photoresist layer, a 248 nm photo-resist layer, a 193 nm photo-resist layer, a 157 nm photo-resist layer, an EUV photo-resist layer, or an electron sensitive resist layer, or a combination of two or more thereof.

5. The method of claim 1, wherein said mask comprises an organic planarization layer or an organic dielectric layer.

6. The method of claim 1, wherein said dielectric layer comprises a low-k dielectric layer or an ultra-low-k dielectric layer.

7. The method of claim 1, wherein said dielectric layer comprises a non-porous SiCOH-containing material or a porous SiCOH-containing material.

8. The method of claim 1, wherein said nitrogen-containing gas comprises $N_2$, or $NH_3$, or both.

9. The method of claim 1, wherein said hydrogen-containing gas comprises $H_2$, or $NH_3$, or both.

10. The method of claim 1, wherein said fluorine-containing gas comprises a $C_xF_yH_z$-containing gas, wherein x and y are an integer greater than or equal to unity and z is an integer greater than or equal to zero.

11. The method of claim 1, wherein said fluorine-containing gas comprises $CHF_3$, $CH_2F_2$, $CF_4$, $C_4F_6$, $C_4F_8$, $C_5F_8$, $NF_3$, or $SF_6$, or any combination of two or more thereof.

12. The method of claim 1, wherein said process gas consists of $N_2$, $H_2$, a fluorine-containing gas, and an optional inert gas.

13. The method of claim 1, wherein said process gas further comprises a noble gas.

14. The method of claim 1, further comprising:
varying an etch selectivity between said dielectric layer and said mask layer during said transferring by adjusting an amount of said fluorine-containing gas relative to an amount of said nitrogen-containing gas and said hydrogen-containing gas.

15. The method of claim 1, further comprising:
reducing an etch selectivity between said dielectric layer and said one or more mask layers during said transferring, wherein said reducing is performed by decreasing an amount of said fluorine-containing gas relative to an amount of said nitrogen-containing gas and said hydrogen-containing gas.

16. The method of claim 1, wherein said performing said plasma etching process further comprises:
setting a pressure in a plasma processing system;
setting a first power level for a first radio frequency (RF) signal applied to a lower electrode within a substrate holder for supporting said substrate; and
setting a second power level for a second RF signal applied to an upper electrode opposing said lower electrode above said substrate.

17. The method of claim 1, wherein said performing said plasma etching process further comprises:
controlling a temperature of said substrate.

18. A method of pattern etching a thin film on a substrate, comprising:
preparing a film stack on a substrate, said film stack comprising a dielectric layer formed on said substrate, and a multi-layer mask comprising an organic planarization layer formed above said dielectric layer, an anti-reflective coating layer formed above said organic planarization layer, and a photoresist layer formed above said anti-reflective coating layer;
creating a pattern in said multi-layer mask through each of said photoresist layer, said anti-reflective coating layer, and said organic planarization layer;
transferring said pattern in said multi-layer mask to said dielectric layer by performing a plasma etching process, wherein said plasma etching process uses a process gas having a nitrogen-containing gas, a hydrogen-containing gas, and a fluorine-containing gas; and
while transferring said pattern to said dielectric layer, substantially removing any remaining portion of said photoresist layer, said anti-reflective coating layer, and said organic planarization layer using said plasma etching process.

19. A method of pattern etching a thin film on a substrate, comprising:
preparing a film stack on a substrate, said film stack comprising a dielectric layer formed on said substrate and a mask comprising one or more mask layers formed above said dielectric layer;
creating a pattern in said mask through each of said one or more mask layers;
transferring said pattern in said mask layer to said dielectric layer by performing a plasma etching process; and
while transferring said pattern to said dielectric layer, substantially removing any remaining portion of each of said one or more mask layers of said mask using said plasma etching process,
wherein said plasma etching process uses a process gas comprising a first gaseous component that etches said dielectric layer at a greater rate than said mask, and
wherein said plasma etching process uses a second gaseous component that etches said dielectric layer at a lower rate than said mask.

20. The method of claim 19, further comprising:
varying an etch selectivity between said dielectric layer and said mask by adjusting an amount of said first gaseous component relative to an amount of said second gaseous component.

* * * * *